United States Patent [19]

Fujie et al.

[11] 3,727,107

[45] Apr. 10, 1973

[54] CURCUIT FOR PROTECTING A.C. LOAD FROM DIRECT CURRENTS

[75] Inventors: Seijiro Fujie, Hodogaya-ku, Yokohama-shi; Kentaro Tani, Ohta-ku, Tokyo, both of Japan

[73] Assignee: Pioneer Electronic Corporation, Tokyo, Japan

[22] Filed: Nov. 16, 1971

[21] Appl. No.: 199,183

[30] Foreign Application Priority Data

Nov. 16, 1970 Japan ..............................45/113495

[52] U.S. Cl...............317/33 R, 307/235, 330/207 P, 307/202

[51] Int. Cl...............................................H02h 7/20

[58] Field of Search..................330/207 P, 51, 30 D; 307/202, 235; 317/27 R, 33 VR, 335 C, 12 R, 12 A, 12 B, 33 R; 323/DIG. 1; 340/248 A, 248 E, 248 F, 253 A, 253 H, 253 N

[56] References Cited

UNITED STATES PATENTS

| | | | |
|---|---|---|---|
| 3,278,770 | 10/1966 | Shoh | 307/235 X |
| 3,250,981 | 5/1966 | Marks | 317/33 VR |
| 3,219,911 | 11/1965 | Burfeindt | 307/202 X |
| 3,486,128 | 12/1969 | Lohrmann | 330/30 D |

*Primary Examiner*—William M. Shoop, Jr.
*Assistant Examiner*—Harvey Fendelman
*Attorney*—Sughrue, Rothwell, Mion, Zinn & Macpeak

[57] ABSTRACT

A protective circuit for protecting an output circuit and a load circuit of a signal amplifier from abnormal conditions and including a differential amplifier for detecting the abnormal conditions of the output circuit and the load circuit. The circuit is particularly useful for protection of an output-condenser-less amplifier.

4 Claims, 1 Drawing Figure

PATENTED APR 10 1973 3,727,107
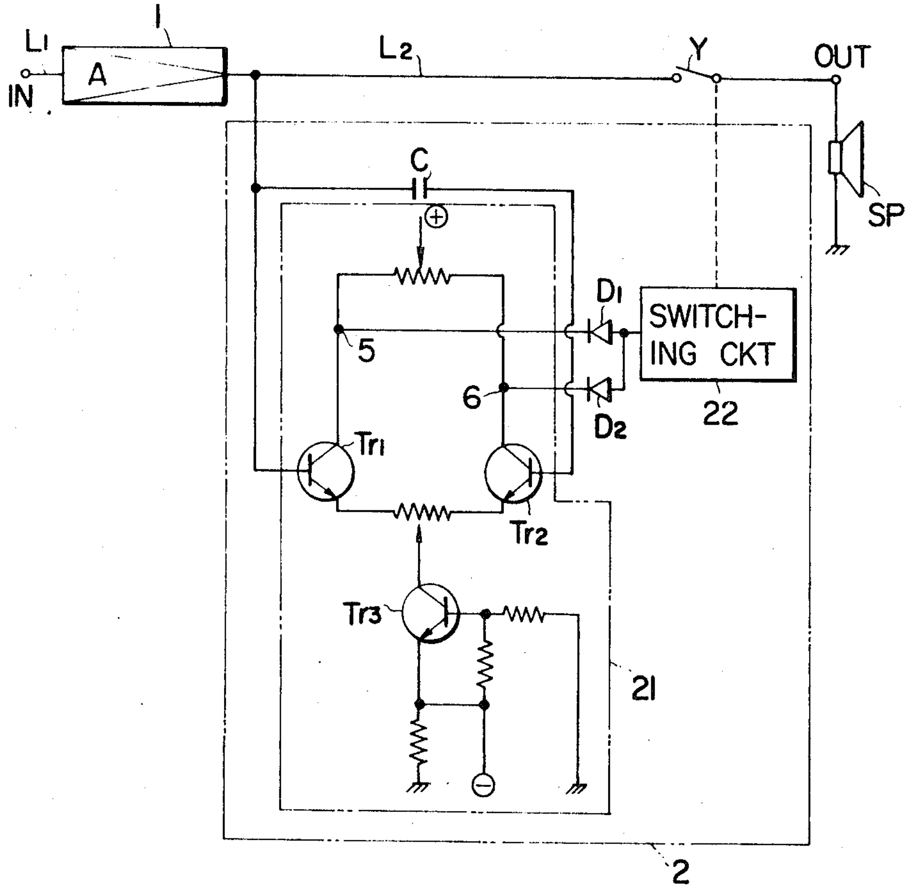
INVENTORS
SEIJIRO FUJIE
KENTARO TANI
BY Sughrue, Rothwell, Mion, Zinn & Macpeak
ATTORNEYS

CURCUIT FOR PROTECTING A.C. LOAD FROM DIRECT CURRENTS

BACKGROUND OF THE INVENTION

1. Field of the Invention

This invention relates to a protective circuit for protecting an output circuit and a load circuit from a variation of a D.C. voltage, and more particularly to a protective circuit useful for an output-condenser-less (O.C.L.) signal amplifier.

2. Description of the Prior Art

In prior art, most audio signal amplifiers have been an output-transformer-less (O.T.L.) amplifier. However, as an amplifier having better performances was required, it was recognized that the output condenser of the O.T.L. amplifier adversely affects the amplifier output signal. An O.T.L. amplifier without an output condenser and having two power sources, known as an output-condenser-less (O.C.L.) amplifier has attracted notice recently. In this O.C.L. amplifier, an output terminal is directly connected to a load circuit without going through an output condenser. Consequently, when the D.C. voltage level of the output signal line varies, a direct current in accordance with the variation of the D.C. voltage flows into the load circuit. As a result, the load circuit such as a loudspeaker, etc., is broken down by the direct current at times. The O.C.L. amplifier needs greater care than the O.T.L. amplifier having the output condenser in respect of providing protection for the load.

SUMMARY OF THE INVENTION

The present invention has been made to cure the afore-mentioned defects.

The primary object of the invention is to provide a protective circuit for securely protecting an output circuit and a load circuit from a variation of D.C. voltage presented in a signal amplifier.

Another object of the invention is to provide a protective circuit particularly useful for an O.C.L. amplifier.

Other objects, advantages and features of the present invention will become apparent from the following description taken in conjunction with the accompanying drawings.

BRIEF DESCRIPTION OF THE DRAWING

The single FIGURE is a circuit diagram showing one embodiment of a protective circuit in accordance with the present invention.

DESCRIPTION OF THE PREFERRED EMBODIMENT

One embodiment of this invention will be explained in accordance with the drawing.

An O.C.L. amplifier 1 has two power sources, that is, a positive power source (+) and a negative power source (−). An input terminal IN and an output terminal OUT are connected with the O.C.L. amplifier 1 via an input-signal line L1 and an output-signal line L2, respectively. These signal lines L1 and L2 are normally at ground potential with respect to a direct current. A loudspeaker SP is connected between the output terminal OUT and ground.

A protective circuit 2 consists of a differential amplifier 21, a condenser C, a switching circuit 22, and a switch contact *y* in the output line L2. The differential amplifier 21 includes transistors T*r*1, T*r*2 and T*r*3. The base of the transistor T*r*1 is connected directly to the output-signal line L2, the base of the transistor T*r*2 is connected to the output-signal line L2 through condenser C, the collector of the transistor T*r*3 is connected to both of the emitters of the transistors T*r*1 and T*r*2 to form a constant-current circuit.

The normally inoperative switching circuit 22 is connected to output terminals of the differential amplifier 21 via diodes D1 and D2, and is operative to open the contact *y* when either output voltage at output terminals 5 and 6 of the differential amplifier 21 becomes lower than a predetermined voltage. In addition, in this embodiment the switching circuit 22 is designed so as to hole the contact *y* in the opened state for a few seconds after the contact *y* has been opened.

The operation of the protective circuit will now be explained. Normally, the output signal line L2 is at ground potential in regard to a D.C. voltage, and the base voltage of the transistor T*r*1 is equal to that of the transistor T*r*2; therefore, the differential amplifier 21 is held in the balanced state wherein the switching circuit 22 is not operated and the contact *y* is closed. In this state, when an A.C. signal is present at the input terminal IN, the input signal is amplified by the signal amplifier 1, and then the amplified signal drives the speaker SP via the closed contact *y*. Furthermore, part of the amplified signal is applied to the protective circuit 2, and reaches the base of the transistor T*r*1 directly and the base of the transistor T*r*2 via the condenser C which blocks D.C. current only. Since the condenser C presents only a negligible impedance to the A.C. signal, the A.C. voltages of both of the transistors T*r*1 and T*r*2 are substantially equal. Consequently, the differential amplifier 21 is normally retained in the balanced state, and the speaker SP continues to be driven.

While in this normal state, if the D.C. potential of the output signal line L2 varies due to some disorder of the amplifier 1, then the voltages being fed to the transistors T*r*1 and T*r*2 become different in magnitude. More specifically, to the base of the transistor T*r*1 is applied both the variation of the D.C. voltage and also the A.C. output signal of the amplifier 1, while to the base of the transistor T*r*2 is applied only the A.C. output signal of the amplifier 1.

Therefore, the differential amplifier 21 goes into the unbalanced state to produce at one of its output terminals 5 and 6 a control signal which operates the switching circuit 22. By the operation of the switching circuit 22, the contact *y* is opened; as a result, the load circuit, that is, the loudspeaker SP, is protected from the disorder of the amplifier 1. In addition, the switching circuit 22, once operated, returns to its original unoperated state after a few seconds to reclose the contact *y*. At this time, if the differential amplifier 21 is still in the unbalanced state, the contact *y* is again opened; consequently, the loudspeaker SP is again securely protected from the disorder.

In the one embodiment described above, the speaker SP is protected from the disorders of the amplifier by opening the contact *y* in the output signal line. This invention is not, however, limited to this embodiment alone, since the important feature of the invention is the combination of a differential amplifier and a condenser for detecting the variation in D.C. voltage. Another object of this invention is to broadly protect the amplifier or the load by using the output of the differential amplifier. This invention is not limited at all as to the way this output is used. That is, the controlling circuit is not limited by this example, but may be a well-known circuit which is operated by the output of the abnormal condition detecting circuit to protect the amplifier or the load. For example, the source may be opened by the controlling circuit and the contact *y* in the output line is not necessarily required.

While the invention has been particularly shown and described with reference to the preferred embodiment thereof, it will be understood by those skilled in the art that various changes in form and details may be made therein without departing from the spirit and scope of the invention.

We claim:

1. A protective circuit for protecting a load circuit supplied by a supply means with current having A.C. and D.C. components, said protective circuit comprising a normally balanced differential amplifier having its input connected to a point between said supply means and said load circuit, said differential amplifier comprising:

a. a first transistor having its input terminal connected directly to said point, b. a second transistor, and c. a condenser connected in series between said point and the input terminal of said second transistor, whereby a variation in said D.C. component is blocked by said condenser to cause said differential amplifier to go into an unbalanced state and produce at its output a control signal.

2. A protective circuit as defined in claim 1, further comprising a normally unoperated switching means operated by said control signal of said differential amplifier for protecting the load circuit.

3. A protective circuit as set forth in claim 2, wherein said switching means comprises a normally closed contact inserted between said point and said load circuit, said contact being opened by the operation of said switching circuit.

4. A protective circuit as defined in claim 3, wherein said supply means is an output-condenser-less signal amplifier.

* * * * *